(12) United States Patent
Hsu et al.

(10) Patent No.: US 7,358,164 B2
(45) Date of Patent: Apr. 15, 2008

(54) CRYSTAL IMPRINTING METHODS FOR FABRICATING SUBSTRATES WITH THIN ACTIVE SILICON LAYERS

(75) Inventors: Louis Lu-Chen Hsu, Fishkill, NY (US); Jack Allan Mandelman, Flat Rock, NC (US); William Robert Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 11/154,907

(22) Filed: Jun. 16, 2005

(65) Prior Publication Data

US 2006/0286781 A1   Dec. 21, 2006

(51) Int. Cl.
*H01L 21/20* (2006.01)

(52) U.S. Cl. .............. 438/486; 438/149; 438/150; 438/166; 438/455; 438/458; 438/479; 438/481; 438/482

(58) Field of Classification Search ........ 438/149–150, 438/166, 455, 458, 479, 481–482, 486
See application file for complete search history.

(56) References Cited

U.S. PATENT DOCUMENTS

| | | | |
|---|---|---|---|
| 4,169,000 A | | 9/1979 | Riseman |
| 5,155,051 A | * | 10/1992 | Noguchi et al. .............. 438/97 |
| 5,198,371 A | | 3/1993 | Li |
| 5,296,410 A | * | 3/1994 | Yang .......................... 438/696 |
| 5,366,923 A | | 11/1994 | Beyer et al. |
| 5,374,564 A | | 12/1994 | Bruel |
| 5,453,394 A | | 9/1995 | Yonehara et al. |
| 5,480,832 A | | 1/1996 | Miura et al. |
| 5,523,602 A | | 6/1996 | Horiuchi et al. |
| 5,734,564 A | | 3/1998 | Brkovic |
| 5,882,987 A | | 3/1999 | Srikrishnan |
| 6,635,534 B2 | | 10/2003 | Madson |
| 6,815,278 B1 | | 11/2004 | Ieong et al. |
| 6,830,962 B1 | | 12/2004 | Guarini et al. |
| 6,972,478 B1 | | 12/2005 | Waite et al. |
| 6,998,684 B2 | | 2/2006 | Anderson et al. |
| 7,060,585 B1 | * | 6/2006 | Cohen et al. ................ 438/355 |
| 7,125,785 B2 | | 10/2006 | Cohen et al. |
| 7,148,092 B2 | * | 12/2006 | Isobe et al. ................. 438/166 |

(Continued)

OTHER PUBLICATIONS

Melanie J. Sherony et al., "Minimization of Threshold Voltage Variation in SOI MOSFETs," Proceedings 1994 IEEE International SOI Conference, Oct. 1994, pp. 131-132.

(Continued)

*Primary Examiner*—Zandra Smith
*Assistant Examiner*—Bac H Au
(74) *Attorney, Agent, or Firm*—Wood, Herron & Evans, LLP

(57) ABSTRACT

Methods of forming semiconductor structures characterized by a thin active silicon layer on an insulating substrate by a crystal imprinting or damascene approach. The methods include patterning an insulating layer to define a plurality of apertures, filling the apertures in the patterned insulating layer with amorphous silicon to define a plurality of amorphous silicon features, and re-growing the amorphous silicon features to define a thin active silicon layer consisting of regrown silicon features. The amorphous silicon features may be regrown such that a number have a first crystal orientation and another number have a different second crystal orientation.

24 Claims, 4 Drawing Sheets

U.S. PATENT DOCUMENTS

| | | | |
|---|---|---|---|
| 2002/0006715 | A1 | 1/2002 | Chhagan et al. |
| 2003/0218171 | A1* | 11/2003 | Isobe et al. ............... 257/64 |
| 2004/0256700 | A1 | 12/2004 | Doris |
| 2005/0030780 | A1 | 2/2005 | Deppe et al. |
| 2005/0082531 | A1 | 4/2005 | Rim |
| 2005/0277260 | A1* | 12/2005 | Cohen et al. ............ 438/387 |
| 2006/0024931 | A1 | 2/2006 | Chan et al. |
| 2006/0073646 | A1 | 4/2006 | Yang |
| 2006/0113605 | A1 | 6/2006 | Currie |
| 2006/0170045 | A1 | 8/2006 | Yan et al. |
| 2006/0231893 | A1 | 10/2006 | Bernstein et al. |
| 2006/0272574 | A1* | 12/2006 | Waite et al. ............... 117/89 |
| 2007/0015346 | A1 | 1/2007 | Cohen et al. |

OTHER PUBLICATIONS

J. A. Mandelman et al., "Floating-Body Concerns for SOI Dynamic Random Access Memory (DRAM)," Proceedings 1996 IEEE International SOI Conference, Oct. 1996, pp. 136-137.

R. Islam et al., "Wafer Level Packaging and 3D Interconnect for IC Technology," 2002 IEEE/SEMI Advanced Semiconductor Manufacturing Conference, pp. 212-217.

N. Sato et al., "Precise Thickness Control for Ultra-Thin SOI in ELTRAN® SOI-Epi™ Wafer," 2002 IEEE International SOI Conference, Oct. 2002, pp. 209-210.

A. Vandooren et al., "Scaling Assessment of Fully-Depleted SOI Technology at the 30nm Gate Length Generation," 2002 IEEE International SOI Conference, Oct. 2002, pp. 25-27.

P. Lindner et al., "3D Interconnect through Aligned Wafer Level Bonding," 2002 Electronic Components and Technology Conference, pp. 1439-1443.

M. Yang et al., "High Performance CMOS Fabricated on Hybrid Substrate With Different Crystal Orientations," 2003 IEEE, pp. 18.7.1-18.7.4.

M. Yang et al., "On the Integration of CMOS with Hybrid Crystal Orientations," 2004 Symposium on VLSI Technology Digest of Technical Papers, pp. 160-161.

Akiko Ohata et al., "Mobility Issues in Ultra-Thin SOI MOSFETs: Thickness Variations, GIFBE and Coupling Effects," 2004 IEEE, pp. 109-112.

Toshinori Numata, "Device Design for Subthreshold Slope and Threshold Voltage Control in Sub-100-nm Fully Depleted SOI MOSFETs," IEEE Transactions on Electron Devices, vol. 51, No. 12, Dec. 2004, pp. 2161-2167.

Sixto Ortiz Jr., http://www.processor.com/Editorial/article.asp?article=articles/p2548/31p48.asp&g..., "IBM Extends Silicon With SSDOI" published Nov. 28, 2003, vol. 25, Issue 48.

* cited by examiner

US 7,358,164 B2

CRYSTAL IMPRINTING METHODS FOR FABRICATING SUBSTRATES WITH THIN ACTIVE SILICON LAYERS

CROSS-REFERENCE TO RELATED APPLICATIONS

This application is related to application Ser. No. 11/154,906, filed Jun. 16, 2005, and application Ser. No. 11/155,030, filed Jun. 16, 2005, the disclosure of each of which is hereby incorporated by reference herein in its entirety.

FIELD OF THE INVENTION

The invention relates to semiconductor substrates and semiconductor structures with thin active silicon layers and fabrication methods for forming such substrates and semiconductor structures.

BACKGROUND OF THE INVENTION

Devices fabricated using silicon-on-insulator (SOI) substrates provide certain performance improvements, such as lower parasitic junction capacitance, in comparison with comparable devices built directly in a bulk silicon substrate. However, semiconductor manufacturers have recognized that straight scaling of either silicon-on-insulator (SOI) device structures or bulk (e.g., non-SOI) device structures cannot improve integrated circuit performance at a rate sufficient to continue current historical trends. To overcome these performance restrictions imposed by physical scalability limitations, integrated circuit designers are exploring other avenues for enhancing device performance. In particular, structural innovations for making smaller and faster transistor devices that consume less power are being explored as alternatives to straight scaling.

Generally, SOI substrates include a thin active layer of silicon partitioned into discrete electrically-isolated islands or regions (i.e., the SOI regions) into which devices are built and a thin buried layer of an insulator, such as oxide ($SiO_2$), electrically isolating the active layer from the rest of the substrate. Traditional transistor devices, such as metal-oxide semiconductor field effect transistors (MOSFET's), feature source and drain regions formed within the active layer of the SOI substrate and a gate defining a channel region in the active layer disposed between the source and drain regions.

The thickness of the silicon active layer of the SOI substrate determines whether the depletion of the channel region will extend beneath the gate fully to an interface between the active silicon layer and the underlying insulator layer. Partially depleted SOI (PDSOI) transistor devices are formed in an active layer that is thick enough that the channel region under typical gate voltages will not be fully depleted across its full thickness when the device is in operation. The design and operation of partially depleted SOI transistor devices and bulk transistor devices are similar. In contrast, the channel region of fully-depleted SOI (FDSOI) transistor devices extends to the interface between the active silicon layer and the underlying buried oxide layer under typical gate voltages.

Although the operation of SOI transistor devices provide certain performance advantages over the operation of comparable bulk devices, SOI transistor devices suffer from floating body effects related to the device isolation from the fixed potential substrate underlying the buried insulator layer. In bulk transistor devices, the device may be electrically connected through the substrate such that the threshold voltage is stable relative to the drain-to-source voltage. In contrast, the un-depleted silicon beneath the gate (e.g., the body) in PDSOI transistor devices is electrically floating with respect to the substrate because of the intervening insulator layer, which lowers the effective threshold voltage and thereby increases the drain current. Consequently, floating body effects may contribute to undesirable performance shifts in the PDSOI transistor device relative to design and instability of the transistor operating characteristics.

FDSOI transistor devices experience reduced floating body problems in comparison to PDSOI transistor devices because the effective thickness of the body is reduced or eliminated. Consequently, semiconductor manufacturers are seeking techniques for effectively thinning the active layer of SOI substrates to an ultra-thin thickness (i.e., less than or equal to about 20 nanometers (nm) and preferably less than about 10 nm) that provides full depletion of the channel region under typical gate voltages. However, the thickness of these thin active layers must be uniform across the entire substrate because device behavior is sensitive to the thickness. Conventional processes for forming active silicon layers in this thickness range are unable to provide satisfactory thickness uniformity.

What is needed, therefore, is an SOI substrate with SOI regions, which are preferably defined in an ultra-thin active silicon layer for building FDSOI devices, and substrate manufacturing methods that overcome these and other disadvantages of conventional SOI substrates and conventional methods of manufacturing such SOI substrates.

SUMMARY OF THE INVENTION

In accordance with one aspect of the present invention, a damascene or imprinting method is provided for fabricating a semiconductor structure on an insulating substrate covered by an insulating layer. The method includes patterning the insulating layer to define a plurality of apertures and filling the apertures in the patterned insulating layer with amorphous silicon to define a plurality of amorphous silicon features. The amorphous silicon features are then re-grown to define regrown silicon features.

In accordance with another aspect of the present invention, a damascene or imprinting method is provided for fabricating a semiconductor structure on an insulating substrate covered by a patterned insulating layer. The method includes forming a plurality of amorphous silicon features in the patterned insulating layer, crystallizing a first number of the amorphous silicon features with a first crystal orientation, and crystallizing a second number of the amorphous silicon features with a second crystal orientation that differs from the first crystal orientation.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1:
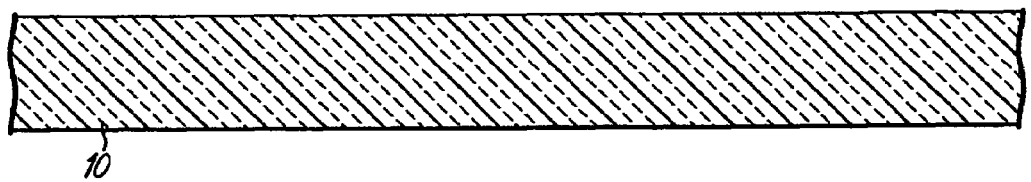
FIGS. 1-10 are diagrammatic cross-sectional views of a portion of a substrate at various stages of a processing method in accordance with an embodiment of the invention.

With reference to FIG. 1, an insulating substrate 10 formed of an insulating material is provided in accordance with an initial step of an embodiment of the processing method of the present invention. The insulating substrate 10 may constitute a monolithic body of an insulating material such as a glass or ceramic, a conductive or semiconductor substrate covered by an insulating film, or a composite of insulating layers.

Figure 2:
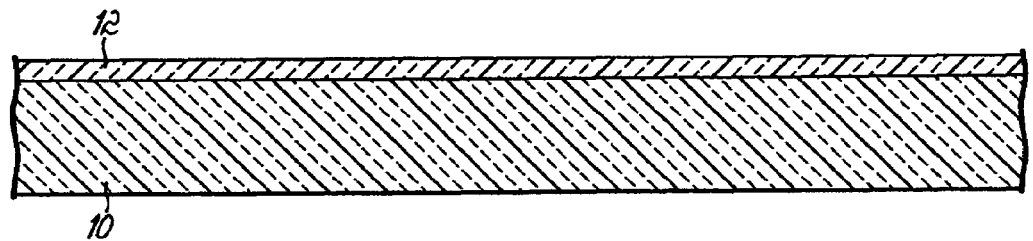

With reference to FIG. 2 in which like reference numerals refer to like features in FIG. 1 and at a subsequent fabrication stage, a hardmask 12 is formed on insulating substrate 10. The hardmask 12 may be composed of an insulating material, like silicon nitride ($Si_3N_4$) or aluminum oxide ($Al_2O_3$), formed utilizing a conventional deposition process such as CVD or plasma-assisted CVD. The hardmask 12 has a hardness and wear resistance so as to be capable of functioning as a hardmask and a polish stop layer. The material forming hardmask 12 must also etch selectively to the insulating substrate 10. Typically, hardmask 12 has a thickness ranging from less than or equal to about 10 nm to about 100 nm. The thickness of the hardmask 12 determines, or substantially determines (if the hardmask 12 is partially eroded during the fabrication process), the thickness of SOI regions 36 (FIG. 10) subsequently formed by the processing method of the present invention. Preferably, the hardmask 12 has a thickness less than or equal to 20 nm, either initially or following the fabrication stage of FIG. 10, such that the thickness of SOI regions 36 is less than or equal to 20 nm. More preferably, the thickness of the hardmask 12, either initially or following the fabrication stage of FIG. 10, is less than or equal to 10 nm so that the fabricated SOI regions 36 have a thickness of less than or equal to 10 nm.

Figure 3:
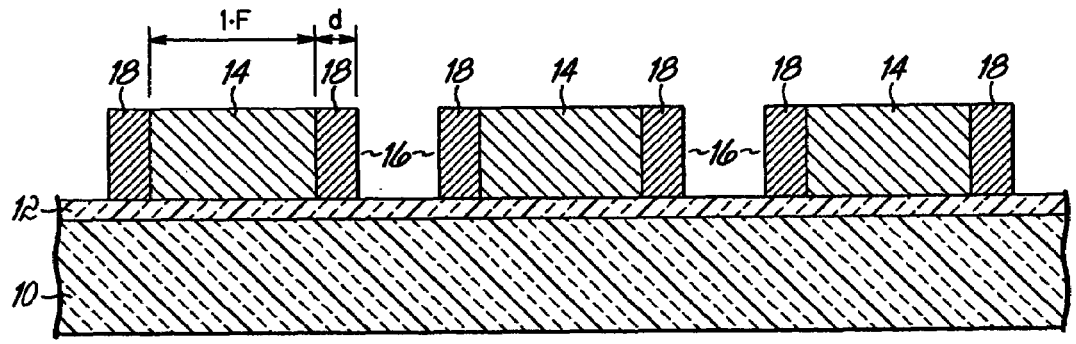
Figure 10:
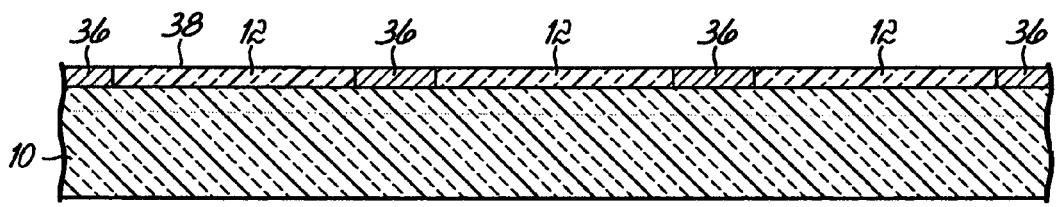

With reference to FIG. 3 in which like reference numerals refer to like features in FIG. 2 and at a subsequent fabrication stage, the hardmask 12 is covered by a patterned sacrificial mask 14 to define prospective locations for the SOI regions 36 (FIG. 10). To that end, a blanket layer of the constituent material of sacrificial mask 14 is formed, preferably conformally, on the surface of hardmask 12 and apertures or openings 16 characteristic of a pattern of SOI regions 36 are formed in this layer using conventional lithography and etching to define the patterned sacrificial mask 14. Specifically, a photoresist (not shown) is applied to an upper horizontal surface of the blanket layer, the photoresist is exposed to a pattern of radiation, the pattern transferred into the exposed photoresist is developed, and then the sacrificial layer is etched using the patterned photoresist as a template to define openings 16. Suitable etching processes include any conventional anisotropic dry etching process, such as reactive-ion etching (RIE) and plasma etching. The chemistry of the etching process, which may be conducted in a single etching step or multiple steps, removes portions of the blanket layer visible through openings 16 and stops vertically on the hardmask 12. The openings 16, which may be lines, are imaged by a subsequent processing step into the hardmask 12. The patterned sacrificial mask 14 is composed of any material, such as polysilicon, that can be etched highly selective to the material of insulating substrate 10 and the material of hardmask 12.

The openings 16 defined in the patterned sacrificial mask 14 may be formed with a minimum feature size of "$1 \cdot F$", wherein "F" refers to the effective resolution of the system or the minimum lithographic feature dimension that can be resolved in a lithographic exposure. After the openings 16 are formed, the vertical sidewalls are bare. However, optional spacers 18 may be deposited on the vertical sidewalls of patterned sacrificial mask 14 bordering the openings 16, which reduces the minimum feature size defined dimensionally by the boundaries of openings 16 to a sub-minimum width less than $1 \cdot F$. The horizontal width, d, of each spacer 18 may be precisely determined by the forming process such that the minimum feature size is reduced to an effective dimension of $((1 \cdot F) - (2 \cdot d))$. The optional spacers 18 may be formed, for example, by a process that includes depositing a layer of a material similar or identical to the material of the patterned sacrificial mask 14 and etching the layer using an anisotropic dry etch technique, such as RIE, that removes the overburden, leaving behind only the portions on the vertical sidewalls of the patterned sacrificial mask 14. The patterned sacrificial mask 14 and the spacers 18 may both be constituted, for example, by polysilicon. The optional spacers 18 may be a single spacer, as shown, or may comprise multiple individual spacers. The process forming the spacers 18 may partially erode the thickness of the sacrificial mask 14, which is tolerated because the sacrificial mask 14 is eventually removed during a subsequent process step and is not present in the completed semiconductor structure.

The present invention contemplates that other known methods of patterning the hardmask 12 may be employed. For example, the patterned sacrificial mask 14 may be replaced by a patterned photoresist layer formed by applying photoresist (not shown) on hardmask 12, exposing the photoresist to a pattern of radiation, and developing the pattern of apertures transferred into the exposed photoresist. Openings 20 (FIG. 4) are formed by a suitable etching process that transfers the pattern of apertures from the patterned photoresist to the hardmask 12.

Figure 4:
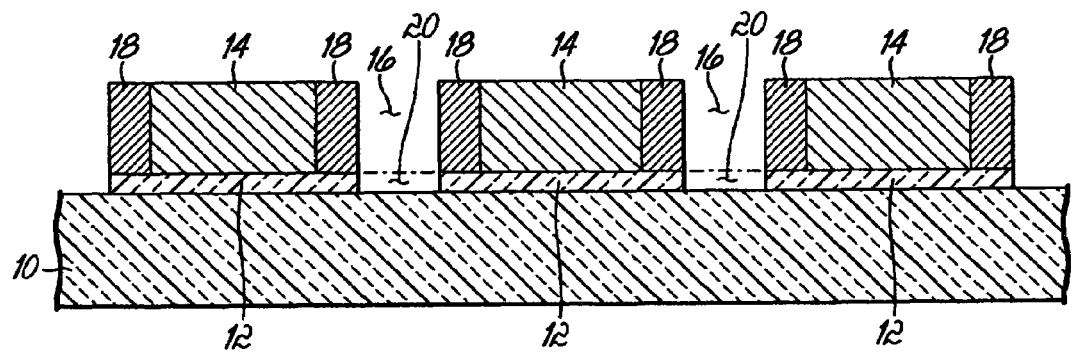

With reference to FIG. 4 in which like reference numerals refer to like features in FIG. 3 and at a subsequent fabrication stage, apertures or openings 20 are formed in hardmask 12 using a conventional etching process that stops vertically on the insulating substrate 10. Suitable etching processes include any conventional anisotropic dry etching process, such as RIE or plasma etching. The etching process is conducted in a single etching step or multiple steps and comprises an etch chemistry selective to the material of insulating substrate 10. The pattern of openings 20 in hardmask 12, which may be lines, represents a transferred image of the openings 16 in sacrificial mask 14. The openings 16 serve as a template for openings 20 and the dimensions of openings 16 are transferred to the dimensions of openings 20. As a result, openings 20 may have a sub-minimum width less than $(1 \cdot F)$ if optional spacers 18 are added to the vertical sidewall bounding each of the openings 16.

Figure 5:
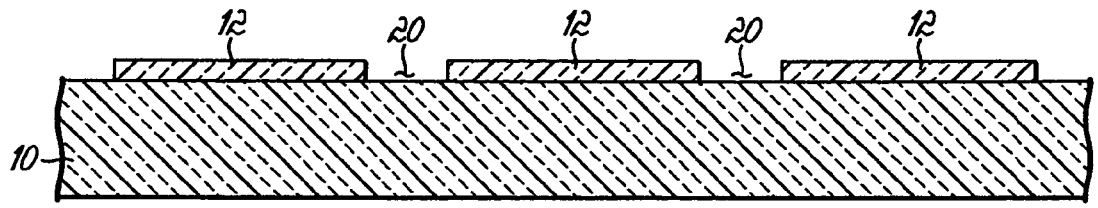

With reference to FIG. 5 in which like reference numerals refer to like features in FIG. 4 and at a subsequent fabrication stage, the sacrificial mask 14 is removed by an etch process. One suitable etch process is a wet etch process using an aqueous mixture of nitric acid ($HNO_3$) and hydrofluoric acid (HF), that etches the sacrificial mask 14 selective to the material of the patterned hardmask 12 and the insulating substrate 10. The resulting structure includes openings 20, in which SOI regions 36 (FIG. 10) are ultimately formed by the processing method of the present invention, and residual portions of the patterned hardmask 12 that operate as lateral electrical isolation between adjacent SOI regions 36 in the fabricated structure (FIG. 10).

Figure 6:
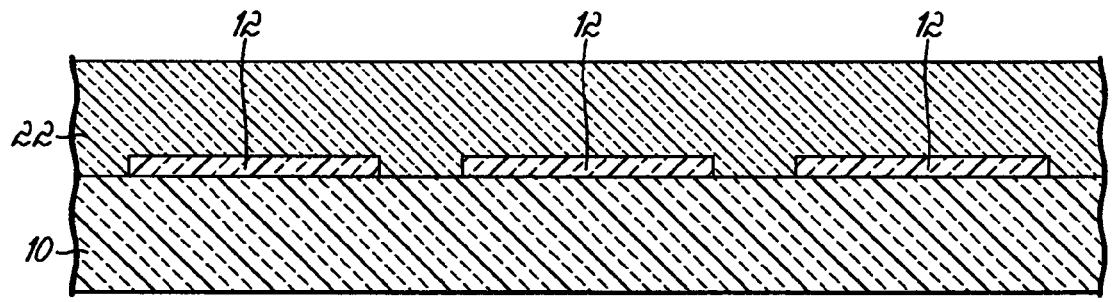

With reference to FIG. 6 in which like reference numerals refer to like features in FIG. 5 and at a subsequent fabrication stage, a layer of amorphous silicon 22 is then formed, preferably conformally, on all exposed horizontal and vertical surfaces of the structure shown in FIG. 5. The amorphous silicon layer 22 may be formed utilizing a conventional deposition process including, for example, CVD or plasma-enhanced (PE) CVD. In one exemplary embodiment of the present invention, a PECVD deposition process is used in which silane is introduced downstream from a hydrogen plasma region, and the silane to hydrogen ratio, RF power, substrate temperature (typically less than 500° C.), and process pressure are adjusted such that amorphous silicon is deposited instead of polycrystalline. The amorphous silicon layer 22 fills the openings 20 defined in the hardmask 12. The invention contemplates that the material in layer 22 may be silicon in any crystalline form suitable for recrystallization in accordance with the present invention. The constituent atoms of amorphous silicon may be arranged randomly so as to completely lack crystalline structure or may exhibit partial crystallinity with localized regions of long range order.

Figure 7:
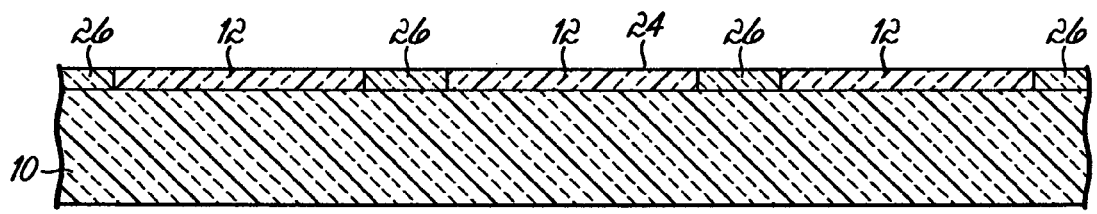

With reference to FIG. 7 in which like reference numerals refer to like features in FIG. 6 and at a subsequent fabrication stage, the upper horizontal surface of amorphous silicon layer 22 is made substantially coplanar with the upper horizontal surface of hardmask 12, preferably by a chemical mechanical polishing (CMP) process, to define a substantially planar exposed surface 24. The resultant planarized structure includes individual plugs or features 26 of amorphous silicon inside openings 20 that extend vertically from exposed surface 24 to the horizontal level of the insulating substrate 10. The CMP process combines abrasion and dissolution to remove the overburden of excess amorphous silicon in layer 22 and stops on the hardmask 12 so that the only residual amorphous silicon from layer 22 resides in features 26 after planarization. Adjacent amorphous silicon features 26 are separated by and coplanar with intervening regions of hardmask 12.

Figure 8:
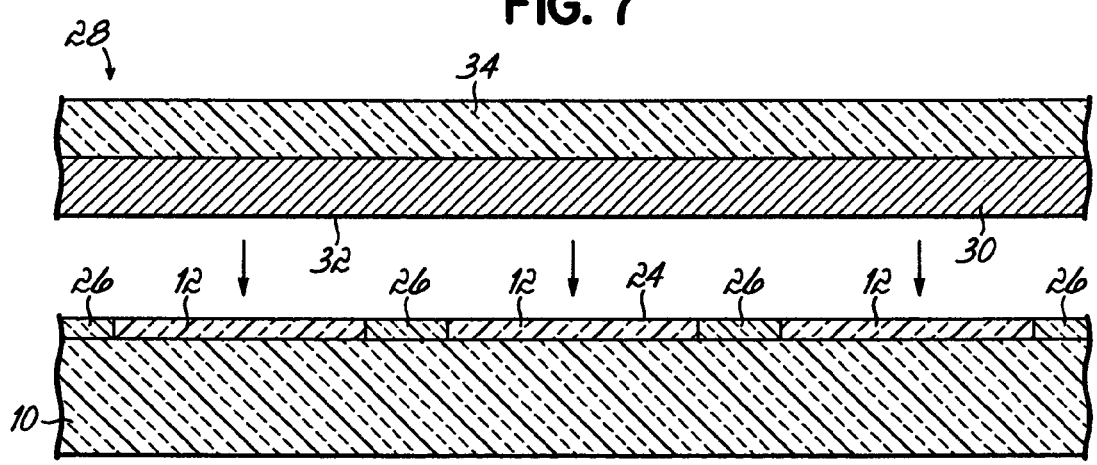

With reference to FIG. 8 in which like reference numerals refer to like features in FIG. 7 and at a subsequent fabrication stage, a seed wafer 28 is provided that has a layer 30 of single crystal silicon of a given crystal orientation and that is applied for re-growing the amorphous silicon features 26 with an established and uniform crystal orientation. The layer 30 has a pre-selected crystal orientation, such as a <100> crystal orientation or a <110> crystal orientation, or another crystal orientation such as <111>. An exposed surface 32 of the seed wafer 28 is preferably optically smooth to promote good contact with the amorphous silicon features 26 and intervening regions of hardmask 12. Seed wafer 28 is illustrated as a conventional SOI substrate having a buried insulator layer 34. However, the invention is not so limited as various other types of seed wafers (not shown) may be used as a template for re-growing the amorphous silicon features 26.

Figure 9:
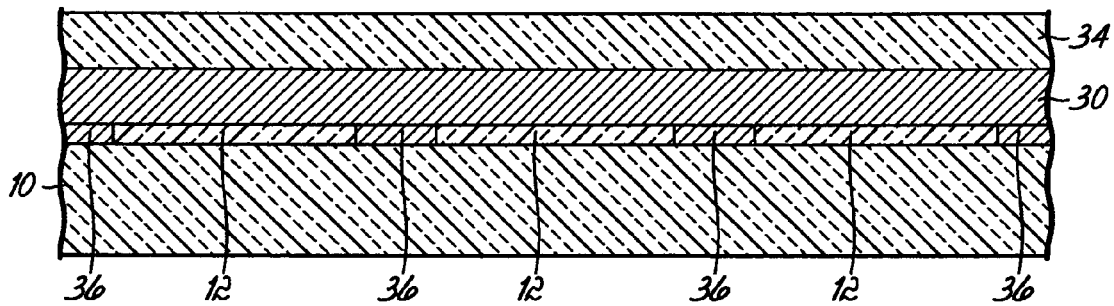

With reference to FIG. 9 in which like reference numerals refer to like features in FIG. 8 and at a subsequent fabrication stage, the exposed surfaces 24, 32 of the amorphous silicon features 26 (FIG. 8) are in intimate contact with the crystalline silicon in an SOI layer 30. The intimate contact, which is typically established at ambient or room temperature, is of a quality sufficient to permit bonding and crystalline growth, as detailed below. The contacting exposed surfaces 24, 32 are bonded together by a conventional bonding process that exposes the contacting surfaces 24, 32 to conditions that are capable of increasing their mutual bonding energy. A typical conventional bonding process involves a low temperature thermal anneal at a sufficient temperature and for a sufficient duration to cause bonding.

For example, one appropriate bonding process includes a thermal treatment or anneal at a temperature within the range of about 400° C. to about 900° C. and for a duration sufficient to precipitate surface-to-surface bonding between contacting surfaces 24, 32. Lower substrate temperatures apply to hydrophobic bonding methods. Optionally, the substrate 10 and seed wafer 28 may be clamped together during the thermal anneal by an external force applying a pressure typically in the range of about 2 kg/cm$^2$ to about 2.5 kg/cm$^2$. The thermal anneal, which may be performed in the presence or absence of an external force, is also typically performed in a controlled atmosphere consisting of an inert gas, such as $N_2$.

This thermal anneal regrows or crystallizes the amorphous silicon in features 26 (FIG. 8) to define SOI regions 36 having a crystal orientation aligned with the crystalline structure of the contacting single crystal material of seed wafer 28, which is used to set a pattern for the crystallization of features 26 in which this pattern is reproduced. Preferably, the thickness of amorphous silicon features 26 is selected such that the crystallization occurs relatively uniformly across the depths of each feature 26 to ultimately provide SOI regions 36. Generally, the volume or thickness of crystalline material in contact with each of the amorphous silicon features 26 should be greater than the volume or thickness of the feature 26. In other words, the contacting crystalline material on seed wafer 28 drives the crystallization of the amorphous silicon features 26 during thermal treatment and re-growth.

With reference to FIG. 10 in which like reference numerals refer to like features in FIG. 9 and at a subsequent fabrication stage, the buried insulator layer 34 of seed wafer 28 is removed by a conventional etching process and then layer 30 of seed wafer 28 is made substantially coplanar with hardmask 12, preferably by a CMP process. The CMP process combines abrasion and dissolution to completely remove the layer 30. In the completed structure, adjacent SOI regions 36 are separated and electrically isolated by intervening regions of hardmask 12 to form an SOI wafer. The completed structure contains SOI regions 36 each having a crystal orientation determined by the crystal orientation of layer 30 of seed wafer 28 (FIGS. 8, 9). The upper horizontal surfaces of the SOI regions 36 and the hardmask 12 are substantially coplanar along an exposed horizontal surface 38 and the SOI regions 36 have substantially the same thickness.

The thickness of the SOI regions 36 is determined by the thickness of the hardmask layer 12, which is highly uniform in thickness across the substrate 10 due to the ability to precisely control thickness uniformity in deposition processes as recognized by a person of ordinary skill in the art. As a result, the thickness of the SOI regions 36 is approximately equal to the initial thickness of the hardmask layer 12, which ranges from about 10 nm to about 100 nm. Preferably, the SOI regions 36 have a thickness in the ultra-thin regime (i.e., less than or equal to 20 nm and, most preferably, less than or equal to 10 nm) suitable to manufacture fully-depleted SOI devices (FDSOI), although the invention is not so limited. More preferably, the fabricated SOI regions 36 have a thickness of less than or equal to 10 nm, which is more beneficial for FDSOI. Due to the planarization during processing (FIG. 10), the SOI regions 36 may be thinned to a thickness less than the initial thickness of the hardmask layer 12 and, in particular, may be thinned to a thickness less than or equal to 20 nm or as thin as less than or equal to 10 nm.

After the fabrication stage of FIG. 10 is completed, substrate 10 is ready for subsequent process steps, such as the formation of semiconductor devices, interlevel insulators, and wiring in the interlevel insulators, to form an integrated circuit. A person of ordinary skill in the art appreciates that numerous SOI regions 36 are distributed across exposed surface 38 of substrate 10 each defining an island for forming one or more active devices.

Generally, this embodiment of the present invention is directed to a method of manufacturing a plurality of coplanar and preferably ultra-thin SOI regions 36, each of which is preferably single crystal or monocrystalline silicon with an identical or similar crystal orientation on substrate 10. Each of the coplanar and preferably ultra-thin SOI regions 36 is electrically isolated from all other regions 36 by insulating material of the insulating substrate 10 and the patterned hardmask 12. The method of manufacture relies on a damascene or crystal imprinting technique, which allows the formation of SOI regions 36, preferably ultra-thin, with tight thickness control.

Figure 11:
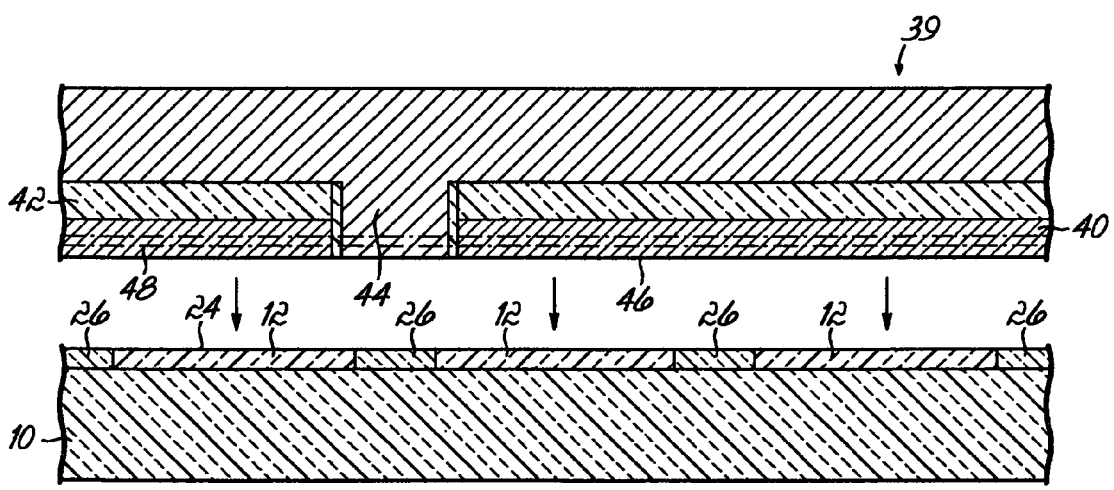
FIGS. 11-14 are diagrammatic cross-sectional views of a portion of a substrate at various stages of a processing method in accordance with an alternative embodiment of the invention.

With reference to FIG. 11 in which like reference numerals refer to like features in FIG. 8 and in accordance with an alternative embodiment of the invention, a seed wafer 39 may be substituted for seed wafer 28 (FIG. 8) at a juncture in the processing method after the fabrication stages of FIGS. 1-7. Seed wafer 39 is a hybrid substrate that carries an SOI layer 40 of silicon, a buried oxide layer 42 separating the SOI layer 40 from seed wafer 39, and bulk silicon regions 44 distributed within the SOI layer 40. The SOI layer 40 has a pre-selected crystal orientation, such as <100>, <110>, or <111>. Each of the bulk silicon regions 44 has a pre-selected crystal orientation (e.g., <100>, <110>, or <111>) that differs from the pre-selected crystal orientation of the SOI layer 40. The bulk silicon regions 44 extend vertically to the seed wafer 39, which has an identical crystal orientation. The bulk silicon regions 44 may be formed by known methods of hybrid crystal orientation familiar to persons of ordinary skill in the art. An exposed surface 46 of the SOI layer 40 and bulk silicon regions 44 is preferably optically smooth. In one embodiment of the present invention, the SOI layer 40 has a <100> crystal orientation and the bulk silicon regions 44 each have a <110> crystal orientation. Substrates suitable for use as seed wafer 39 are disclosed, for example, in M Yang et al., "On the Integration of CMOS with Hybrid Crystal Orientations," pp. 18.7.1-.4, IEEE VLSI Tech. Symp. (2004), and in M. Yang, "High-Performance CMOS Fabricated on Hybrid Substrate with Different Crystal Orientations," pp. 160-61, IEEE IEDM (2004), the disclosure of each of which is hereby incorporated by reference herein in its entirety.

The seed wafer 39 is ion implanted, before being contacted and bonded with substrate 10, using a conventional ion implantation process with hydrogen ions, or other rare gas ions, of relatively low energy to create a shallow and narrow damaged region or band 48. Typically, the depth of the stressed damaged band 48 is about 50 nm to about 200 nm vertically beneath the exposed surface 46. The hydrogen or other rare gas ions will reside predominantly across the damaged band 48 in a profile with a varying concentration as a function of depth below surface 46 and at a depth beneath surface 46 roughly centered about the average penetration depth of the ions. This damaged band 48, after an appropriate thermal treatment, defines a cleaving plane that permits subsequent separation of a thin upper layer generally between band 48 and exposed surface 46. Exemplary processes for forming the damaged band 48 and the subsequent cleaving along the damaged band 48 include the Smart Cut™ process recognized by a person of ordinary skill in the art as a conventional technique used to fabricate bonded SOI substrates, and the process described in U.S. Pat. Nos. 5,374,564 and 5,882,987, the disclosure of each of which is hereby incorporated by reference herein in its entirety.

The exposed surface 46 on the seed wafer 39 is manipulated into a confronting relationship with the planarized exposed surface 24 on substrate 10 with amorphous silicon features 26. The substrate 10 and seed wafer 39 are aligned relative to each other such that the bulk silicon regions 44 are registered spatially with a fraction of the amorphous silicon features 26. After alignment, the remaining amorphous silicon features 26 confront the crystalline silicon in the SOI layer 40. Techniques for achieving alignment of substrate 10 and seed wafer 39 are known to persons of ordinary skill in the art. For example, one conventional alignment technique includes an equipment arrangement having an upper illumination source (e.g., a laser) with viewing optics and a lower illumination source also with viewing optics. After mutually aligning the beams from the two illumination sources, substrate 10 is positioned between the two illumination sources with the exposed surface 24 oriented such that the downward-directed beam from the upper source is aligned with an alignment mark, such as one of the amorphous silicon features 26. Substrate 10 is temporarily removed and the alignment procedure is repeated for seed wafer 39 using another alignment mark, such as one of the bulk silicon regions 44. After seed wafer 39 is aligned, substrate 10 is returned to its original aligned position.

Figure 12:
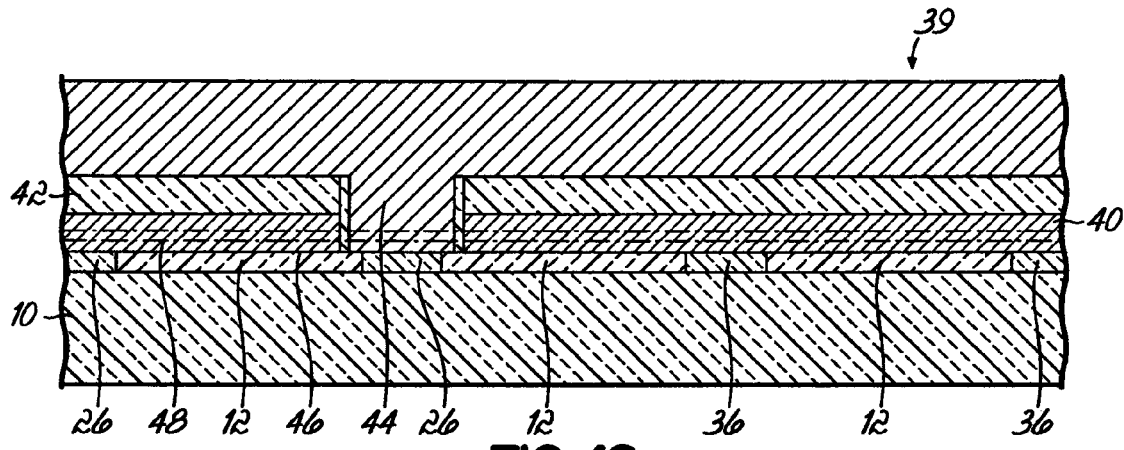

With reference to FIG. 12 in which like reference numerals refer to like features in FIG. 11 and at a subsequent fabrication stage, the exposed surfaces 24, 46 are contacted such that the bulk silicon regions 44 in the SOI layer 40 on seed wafer 39 are in intimate contact with a fraction of the amorphous silicon features 26 on substrate 10. The remaining amorphous silicon features 26 are in intimate contact with the crystalline silicon in the SOI layer 40. The intimate contact, which is typically established at ambient or room temperature, is of a quality sufficient to permit bonding and crystalline growth, as detailed below.

The contacting exposed surfaces 24, 46 are bonded together by a conventional bonding process that exposes the contacting surfaces 24, 46 to conditions that are capable of increasing their mutual bonding energy. A typical conventional bonding process involves a low temperature thermal anneal at a sufficient temperature and for a sufficient duration to cause bonding. However, the temperature of the thermal anneal is limited so as not to cause premature separation to occur along the damaged band 48. For example, one appropriate bonding process includes a thermal treatment or anneal at a temperature within the range of about 400° C. to about 500° C. and for a duration sufficient to precipitate surface-to-surface bonding between contacting surfaces 24, 46. Optionally, the substrate 10 and seed wafer 39 may be clamped together during the thermal anneal by an external force applying a pressure typically in the range between about 2 kg/cm$^2$ and about 2.5 kg/cm$^2$. The thermal anneal, which may be performed in the presence or absence of an external force, is also typically performed in a controlled atmosphere consisting of an inert gas, such as $N_2$.

This initial low temperature thermal anneal may also at least partially regrow or crystallize the amorphous silicon in features 26, such that the corresponding crystal orientation in the partially crystallized form selectively aligns with the adjacent crystalline structure of the contacting single crystal material used to set a pattern for the crystallization of features 26 in which this pattern is reproduced. The crystalline silicon constituting the first crystal orientation in the SOI layer 40 and the crystalline silicon of the second crystal orientation in the bulk silicon regions 44 operate as seeds for crystalline growth of the contacting amorphous silicon features 26. Specifically, amorphous silicon features 26 in contact with the bulk silicon regions 44 in the SOI layer 40 at least partially crystallize in a crystal structure having the crystal orientation of the bulk silicon regions 44. The remaining amorphous silicon features 26 at least partially crystallize in a crystal structure having the crystal orientation of the SOI layer 40.

Preferably, the thickness of amorphous silicon features 26 is selected such that the crystallization, when complete, occurs relatively uniformly across their respective depths. Generally, the volume or thickness of crystalline material in contact with each of the amorphous silicon features 26 is greater than the volume or thickness of the corresponding feature 26. In other words, the contacting crystalline material drives the crystallization of the amorphous silicon features 26 during thermal treatment.

Figure 13:
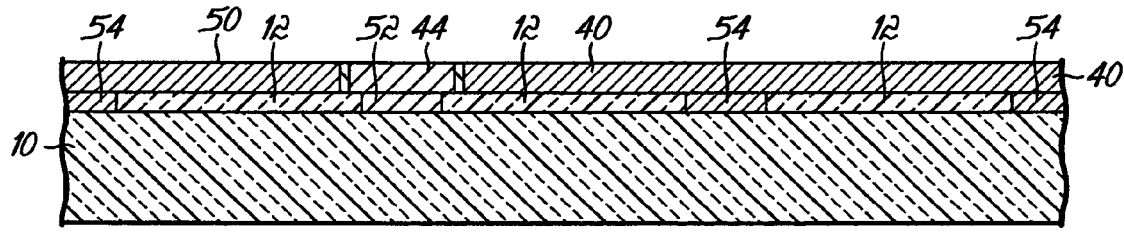

With reference to FIG. 13 in which like reference numerals refer to like features in FIG. 12 and at a subsequent fabrication stage, the bonded substrate 10 and seed wafer 39 are thermally treated in an inert atmosphere and at a temperature greater than the temperature of the preceding thermal treatment (FIG. 12) that causes bonding. Preferably, the thermal treatment or anneal is at a temperature in the range of about 700° C. to about 1100° C. and for a duration sufficient to cause the hydrogen, or other rare gas, in the damaged band 48 to coalesce into microscopic bubbles localized within the damaged band 48. The formation of gas bubbles in the damaged band 48 causes the SOI layer 40 and bulk silicon regions 44 to separate along a cleaving plane defined by the damaged band 48. A new exposed surface 50 results after separation along the cleaving plane. Portions of the residual SOI layer 40 and bulk silicon regions 44 between the exposed surface 46 (FIG. 12) and the damaged band 48 remain bonded to the surface 24 of substrate 10. However, due to a subsequent planarization step in FIG. 14, the residual SOI layer 40 and bulk silicon regions 44 are removed after conversion of the amorphous silicon features 26 to crystalline structures. This transfer technique that provides the template for regrowth of amorphous silicon features 26 also reduces the residual thickness of the seed wafer 39 that is removed in a subsequent fabrication stage.

The high-temperature thermal treatment may complete the crystallization of any amorphous silicon features 26 (FIG. 12) remaining after the previous low-temperature thermal anneal. Specifically, amorphous silicon features 26 (FIG. 12) previously in contact with the bulk silicon regions 44 in the SOI layer 40 crystallize as active silicon regions or SOI regions 52 and have the crystal orientation of the bulk silicon regions 44 on seed wafer 39. The remaining amorphous silicon features 26 (FIG. 12) previously in contact with the SOI layer 40 crystallize as active silicon regions or SOI regions 54 and possess the crystal orientation of the SOI layer 40. Consequently, the SOI regions 52, 54 will have different crystal orientations because the SOI layer 40 and bulk silicon regions 44, which provide the template for re-growth, have different crystal orientations. Crystallization occurs across the thickness of the amorphous silicon features 26. The high temperature thermal anneal will also increase the bond strength across the interface between the contacting surfaces 24, 46.

Figure 14:
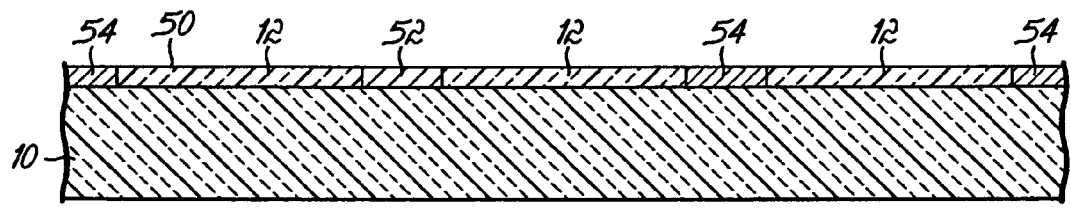

With reference to FIG. 14 in which like reference numerals refer to like features in FIG. 13 and at a subsequent fabrication stage, the exposed surface 50 is made substantially coplanar with the upper horizontal surface of hardmask 12, preferably by a CMP process. The CMP process combines abrasion and dissolution to remove the overburden of the residual SOI layer 40 and bulk silicon regions 44. In the completed structure, adjacent SOI regions 52 and SOI regions 54 are separated and electrically isolated by intervening regions of hardmask 12 to form an SOI wafer. The completed structure contains SOI regions 52 of one crystal orientation and SOI regions 54 of a different crystal orientation than SOI regions 52. The upper horizontal surfaces of the regions 52, 54 are substantially coplanar and the SOI regions 52, 54 have substantially the same thickness. Preferably, each of the crystal orientations is substantially equal to one of the <100>, <110>, or <111> principle axes.

The thickness of the SOI regions 52, 54 is determined by the thickness of the hardmask layer 12, which is highly uniform in thickness due to the ability to precisely control thickness uniformity in deposition processes as recognized by a person of ordinary skill in the art. As a result, the thickness of the SOI regions 52, 54 is approximately equal to the initial thickness of the hardmask layer 12, which ranges from about 10 nm to about 100 nm. Preferably, the SOI regions 52, 54 have a thickness in the ultra-thin regime (i.e., less than or equal to 20 nm) suitable to manufacture fully-depleted SOI devices (FDSOI), although the invention is not so limited. More preferably, the fabricated SOI regions 52, 54 have a thickness of less than or equal to 10 nm, which is more beneficial for FDSOI. Due to the planarization during processing (FIGS. 7, 14), the SOI regions 52, 54 may be thinned to a thickness less than the initial thickness of the hardmask layer 12 and, in particular, may be thinned to a thickness less than or equal to 20 nm or as thin as less than or equal to 10 nm. A person of ordinary skill in the art appreciates that numerous SOI regions 52, 54 are distributed across the exposed surface 50 of substrate 10, typically in a pattern of repeating groups amenable to the replication of an identical set of active devices in each group in the pattern.

After the fabrication stage of FIG. 14 is completed, substrate 10 is ready for subsequent process steps, such as the formation of semiconductor devices, interlevel insulators, and wiring in the interlevel insulators, to form an integrated circuit. In accordance with the present invention, SOI regions 52 and SOI regions 54 may include different types of semiconductor devices appropriate for such SOI regions 52, 54. Generally, any type of field effect transistor (FET), such as, for example, N-channel metal oxide semiconductor (MOS) FET's, P-channel MOS FET's, complimentary metal oxide semiconductor (CMOS) FET's, bipolar transistors such as lateral bipolar transistors, and the like may be built in the SOI regions 52, 54. Persons of ordinary skill in the art comprehend conventional FET structures that may be fabricated in the SOI regions 52, 54 and the standard processing steps applied to form those conventional structures.

As a specific example of one advantage of the present invention, SOI regions 52 may have a <100> crystal orientation that optimizes or enhances carrier mobility (i.e., device performance) for N-channel MOSFET's in comparison with other orientations, and SOI regions 54 may have a <110> crystal orientation that optimizes or enhances carrier mobility for P-channel MOSFET's in comparison with other orientations. Consequently, all or a large fraction of the SOI regions 52 may further include an N-channel MOSFET (not shown), and all or a large fraction of SOI regions 54 may further include a P-channel MOSFET (not shown). Because the SOI regions 52, 54 with the differing crystal orientations are located on an insulator (i.e., insulating substrate 10), devices formed thereon will be N-channel and P-channel SOI-MOSFET's.

Generally, this embodiment of the present invention is directed to a structure and method of manufacture for a plurality of coplanar ultra-thin SOI regions 52, 54, each of which has one of two different crystal orientations on substrate 10. Each of the coplanar ultra-thin SOI regions 52, 54 is electrically isolated from all other regions 52, 54 by insulating material from insulating substrate 10 and insulating material from hardmask 12. The manufacturing method of the invention uses a damascene or crystal imprinting technique, which allows the formation of ultra-thin SOI regions 52, 54 with tight thickness control. The coplanarity of the regions 52, 54 reduces depth of focus concerns that have been experienced with conventional substrates of poor planarity.

The present invention represents a significant advancement over conventional SOI substrates that are limited to standard thickness SOI regions and that are not amenable to the fabrication of ultra-thin SOI. Consequently, the present invention assists in overcoming the physical scalability limitations of CMOS technologies. A person of ordinary skill in the art will recognize that SOI regions having an arbitrary plurality of different crystal orientations may be fabricated consistent with the present invention with a suitable seed wafer to provide the differently oriented seeds for crystallization.

References herein to terms such as "vertical", "horizontal", etc. are made by way of example, and not by way of limitation, to establish a frame of reference. The term "horizontal" as used herein is defined as a plane parallel to the conventional plane or surface of substrate 10, regardless of the actual spatial orientation of substrate 10. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the present invention.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of fabricating a semiconductor structure on an insulating substrate covered by an insulating layer, comprising:
   patterning the insulating layer to define a plurality of apertures;
   filling the apertures in the patterned insulating layer with amorphous silicon to define a plurality of amorphous silicon features;
   contacting each of the amorphous silicon features with a respective one of a plurality of crystal seed regions; and
   re-growing the amorphous silicon features using the crystal seed regions as crystal growth seeds for the amorphous silicon to define a plurality of regrown crystalline silicon features.

2. The method of claim 1 wherein filling the apertures further comprises:
   depositing an amorphous silicon layer on the patterned insulating layer to fill the apertures; and
   removing portions of the amorphous silicon layer to expose the patterned insulating layer and leave the amorphous silicon features in the apertures.

3. The method of claim 2 wherein patterning the insulating layer further comprises:
   forming a sacrificial mask on the insulating layer;
   forming a plurality of openings in the sacrificial mask each having a minimum feature size and each positioned at an intended location of one of the apertures;
   narrowing each of the openings to provide a reduced feature size smaller than the minimum feature size;
   transferring an image of the reduced-size openings from the sacrificial mask to the insulating layer to define the apertures with the reduced feature size; and
   removing the sacrificial mask.

4. The method of claim 3 where narrowing each of the openings further comprises:
   forming a sidewall spacer on each of the openings to provide the reduced feature size.

5. The method of claim 2 wherein removing portions of the amorphous silicon layer further comprises:
   planarizing the amorphous silicon layer.

6. The method of claim 5 further comprising:
   stopping the planarization on the patterned insulating layer so that the patterned insulating layer and the amorphous silicon features are substantially coplanar.

7. The method of claim 1 wherein the amorphous silicon features are positioned between the insulating substrate and the respective one of the crystal seed regions.

8. The method of claim 7 wherein re-growing the amorphous silicon features further comprises:
   bonding the patterned insulating layer and the amorphous silicon features with a seed wafer carrying the crystal seed regions;
   thermally treating the amorphous silicon features to a temperature sufficient to cause regrowth; and
   removing the seed wafer after regrowth.

9. The method of claim 1 wherein the regrown crystalline silicon features have a crystal orientation selected from the group consisting of <100>, <110>, and <111>.

10. The method of claim 1 wherein a first number of the regrown crystalline silicon features and the crystal seed regions have a first crystal orientation, and a second number of the regrown crystalline silicon features and the crystal seed regions have a second crystal orientation that differs from the first crystal orientation.

11. The method of claim 10 wherein the first and second crystal orientations are selected from the group consisting of <100>, <110>, and <111>.

12. The method of claim 1 wherein the regrown crystalline silicon features have a thickness of less than or equal to 20 nm.

13. The method of claim 1 wherein the regrown crystalline silicon features have a thickness of less than or equal to 10 nm.

14. The method of claim 1 further comprising:
forming the insulating layer with a thickness greater than or equal to the thickness of the regrown crystalline silicon features.

15. A method of fabricating a semiconductor structure on an insulating substrate covered by a patterned insulating layer, comprising:
forming a plurality of amorphous silicon features in the patterned insulating layer;
contacting each of the amorphous silicon features with a respective one of a plurality of crystal seed regions each having either a first crystal orientation or a second crystal orientation that differs from the first crystal orientation, wherein each of the first number of the amorphous silicon features is positioned between the substrate and a respective one of the crystal seed regions of the first crystal orientation; and
crystallizing the amorphous silicon features to form a plurality of crystalline silicon features of the first crystal orientation using the crystal seed regions of the first crystal orientation as crystal growth seeds for the contacted amorphous silicon regions and a plurality of crystalline silicon features of the second crystal orientation using the crystal seed regions of the second crystal orientation as crystal growth seeds for the contacted amorphous silicon regions.

16. The method of claim 15 wherein each of the second number of the amorphous silicon features is positioned between the substrate and a respective one of the crystal seed regions of the second crystal orientation.

17. The method of claim 15 wherein forming the plurality of amorphous silicon features further comprises:
patterning the insulating layer to define a plurality of apertures each corresponding with a location of one of the amorphous silicon features; and
filling the apertures in the patterned insulating layer with amorphous silicon to define the amorphous silicon features.

18. The method of claim 17 wherein filling the apertures in the patterned insulating layer with amorphous silicon further comprises:

depositing an amorphous silicon layer on the patterned insulating layer to fill the apertures; and
removing portions of the amorphous silicon layer to expose the patterned insulating layer and leave the amorphous silicon features in the apertures.

19. The method of claim 18 wherein removing portions of the amorphous silicon layer further comprises:
planarizing the amorphous silicon layer.

20. The method of claim 19 further comprising:
stopping the planarization on the patterned-insulating layer so that the patterned insulating layer and the amorphous silicon features are substantially coplanar.

21. The method of claim 15 wherein the first and second crystal orientations are selected from the group consisting of <100>, <110>, and <111>.

22. The method of claim 15 wherein the regrown crystalline silicon features have a thickness of less than or equal to 20 nm.

23. The method of claim 15 wherein the regrown crystalline silicon features have a thickness of less than or equal to 10 nm.

24. A method of fabricating a semiconductor structure on an insulating substrate covered by a patterned insulating layer, comprising:
forming a plurality of amorphous silicon features in the patterned insulating layer;
bonding the patterned insulating layer and the amorphous silicon features with a seed wafer carrying a plurality of crystal seed regions each having either a first crystal orientation or a second crystal orientation that differs from the first crystal orientation so as to contact each of the amorphous silicon features with a respective one of the plurality of crystal seed regions;
thermally treating the amorphous silicon features to a temperature sufficient to cause crystallization of the amorphous silicon features to form a plurality of crystalline silicon features of the first crystal orientation using the crystal seed regions of the first crystal orientation as crystal growth seeds for the contacted amorphous silicon regions and a plurality of crystalline silicon features of the second crystal orientation using the crystal seed regions of the second crystal orientation as crystal growth seeds for the contacted amorphous silicon regions; and
removing the seed wafer after regrowth.

* * * * *